United States Patent [19]

Murakami

[11] Patent Number: 5,048,412
[45] Date of Patent: Sep. 17, 1991

[54] APPARATUS FOR PROCESSING SEMICONDUCTOR PACKAGES AND THE LIKE

[75] Inventor: Hiroshi Murakami, Sparks, Nev.

[73] Assignee: Y.K.C. Co., Ltd., Japan

[21] Appl. No.: 516,348

[22] Filed: Apr. 30, 1990

[30] Foreign Application Priority Data

Jan. 25, 1990 [JP] Japan ............................ 2-13518

[51] Int. Cl.⁵ .................... B30B 7/00; B30B 1/26; B30B 15/30
[52] U.S. Cl. .................................. 100/137; 72/405; 72/452; 100/207; 100/208; 100/215; 100/292
[58] Field of Search ............... 100/53, 137, 207, 208, 100/215, 291, 292; 414/752, 225, 750; 72/452, 405

[56] References Cited

U.S. PATENT DOCUMENTS

| | | | |
|---|---|---|---|
| 3,199,358 | 8/1965 | Bradlee | 100/292 X |
| 3,557,599 | 1/1971 | Eickenhorst | 100/292 X |
| 3,779,155 | 12/1973 | Ohno | 100/207 |
| 4,354,790 | 10/1982 | Karl | 100/207 X |

FOREIGN PATENT DOCUMENTS

| | | | |
|---|---|---|---|
| 52-8578 | 1/1977 | Japan | 100/207 |
| 844611 | 8/1960 | United Kingdom | 100/208 |

Primary Examiner—Harvey C. Hornsby
Assistant Examiner—Stephen F. Gerrity
Attorney, Agent, or Firm—Howson and Howson

[57] ABSTRACT

In a press for cutting and bending the leads of semiconductor packages, a series of cams on a common drive shaft operate both the feeding mechanism and the working presses to achieve high speed operation, up to 500 cycles per minute, through accurate timing and avoidance of delays inherent in fluid-operated presses. The path of movement of the packages through the apparatus is linear, and the axis of the camshaft is parallel to the path of movement.

6 Claims, 8 Drawing Sheets

APPARATUS FOR PROCESSING SEMICONDUCTOR PACKAGES AND THE LIKE

BRIEF SUMMARY OF THE INVENTION

This invention relates to presses, and more particularly to a press apparatus for processing semiconductor packages and the like during manufacture, for the purpose of bending leads and separating individual packages from sheets of multiple packages.

In conventional semiconductor package processing presses, the sheet feeding mechanisms and the working presses are operated by separate power sources. For example the working presses may be hydraulically or pneumatically driven. With pneumatically or hydraulically driven working presses, it is difficult to synchronize the presses with the article feeding mechanisms. Hydraulic and pneumatic presses also have inherent speed limitations, e.g. 70 cycles per minute, which make high speed operation impossible. They also produce noise and vibration, and occupy a large amount of space.

The principal objects of this invention are to overcome one or more of the above-mentioned difficulties encountered in the operation of conventional presses; that is to provide presses in which the feeding mechanisms are synchronized with the operation of the working presses, in which articles are fed and processed at higher speed, in which articles are processed with less noise and vibration, and which require less space. It is also an object of the invention to provide presses which are comparatively simple, which are inexpensive, and which are easy to operate and maintain.

This invention addresses the above problems of conventional presses by moving articles through a predetermined pitch by means of a feeding mechanism operated by the same driving source which operates the working presses. Preferably, the apparatus utilizes a series of cams on a common drive shaft to operate both the feeding mechanism and the working presses.

In the preferred embodiment of the invention, an apparatus for processing semiconductor packages and the like comprises a series of work presses. Each press of the series is adapted to perform a separate operation on a package sheet, that is a sheet containing multiple semiconductor packages. Operations may include, for example, initial cutting of some of the leads on the packages to effect partial separation of the package from the sheet, bending of the leads, and final separation of the packages from the sheet. Feeding means are provided for moving package sheets to and from each of the work presses in succession. The feeding means comprises at least one article support movable toward and away from a path extending through the work presses, and at least one article feeding lever reciprocably movable along the direction of the path. The article feeding lever has means for engaging package sheets and indexing the package sheets along the path by movement of the article feeding lever in a forward direction when the article support is moved toward the path. The article feeding lever is also movable in a reverse direction without reverse movement of the package sheets when the article support is moved away from the path. First cam means are provided for operating the work presses. Second cam means are provided for effecting reciprocating movement of the article feeding lever along the direction of the path. Third cam means are provided for effecting movement of the article support toward and away from the path. All of these cam means are arranged on a common drive shaft.

Feeding of articles is effected by a mechanism comprising a vertically movable support base and a horizontally movable feeding lever, the support base and the feeding lever being operated by separate cams arranged on a common drive shaft. When the support base is raised, the article supported on the base is positioned for engagement by the feeding lever, which moves the article forward to a position in which it can be worked by a working press. When the support base is lowered, the article disengages from the feeding lever. The working press begins its operation on the article when the support base has reached its lowermost position. After the article being worked disengages from the feeding lever, the feeding lever is returned to its original position while the working press is in operation. The required timing of the various steps is accomplished by cams, all disposed on a common driving shaft.

DETAILED DESCRIPTION

Figure 7:
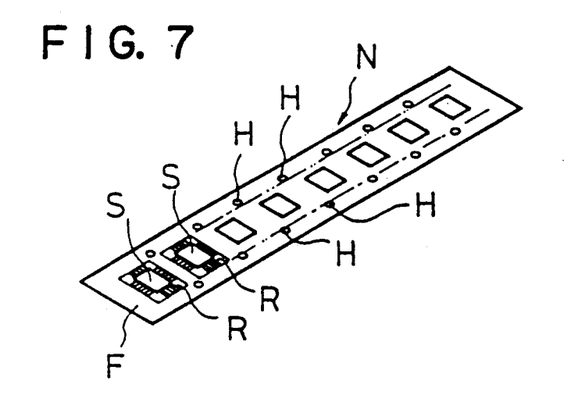
FIG. 7 is a perspective view of a semiconductor package sheet.
Figure 8:
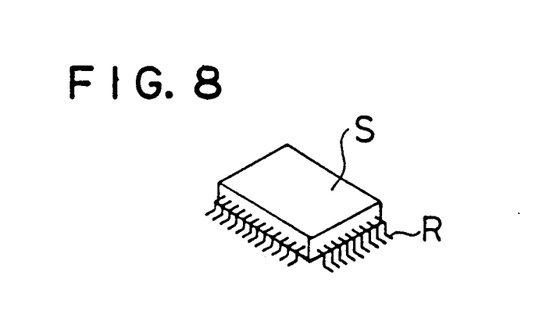
FIG. 8 is a perspective view of a typical finished semiconductor package.

The preferred embodiment of the invention will be described as an apparatus adapted for use in production of relatively small semiconductor packages. As shown in FIG. 7, a plurality of semiconductor packages S are included in a semiconductor package sheet N retained in a frame F. The sheets N are to be processed, by cutting, lead bending, and separation carried out by the press in accordance with the invention, to produce individual packages S, as shown in FIG. 8.

As illustrated in FIGS. 2-6, the press is mounted on a base 12. It comprises a driving mechanism 20 (FIG. 1), a single drive shaft 22 (FIGS. 1, 2 and 3), a plurality of cams, C1-C7, disposed on the shaft, a feeding mechanism, and a plurality of working presses. The feeding mechanism and the presses are all driven by the cams.

Figure 1:
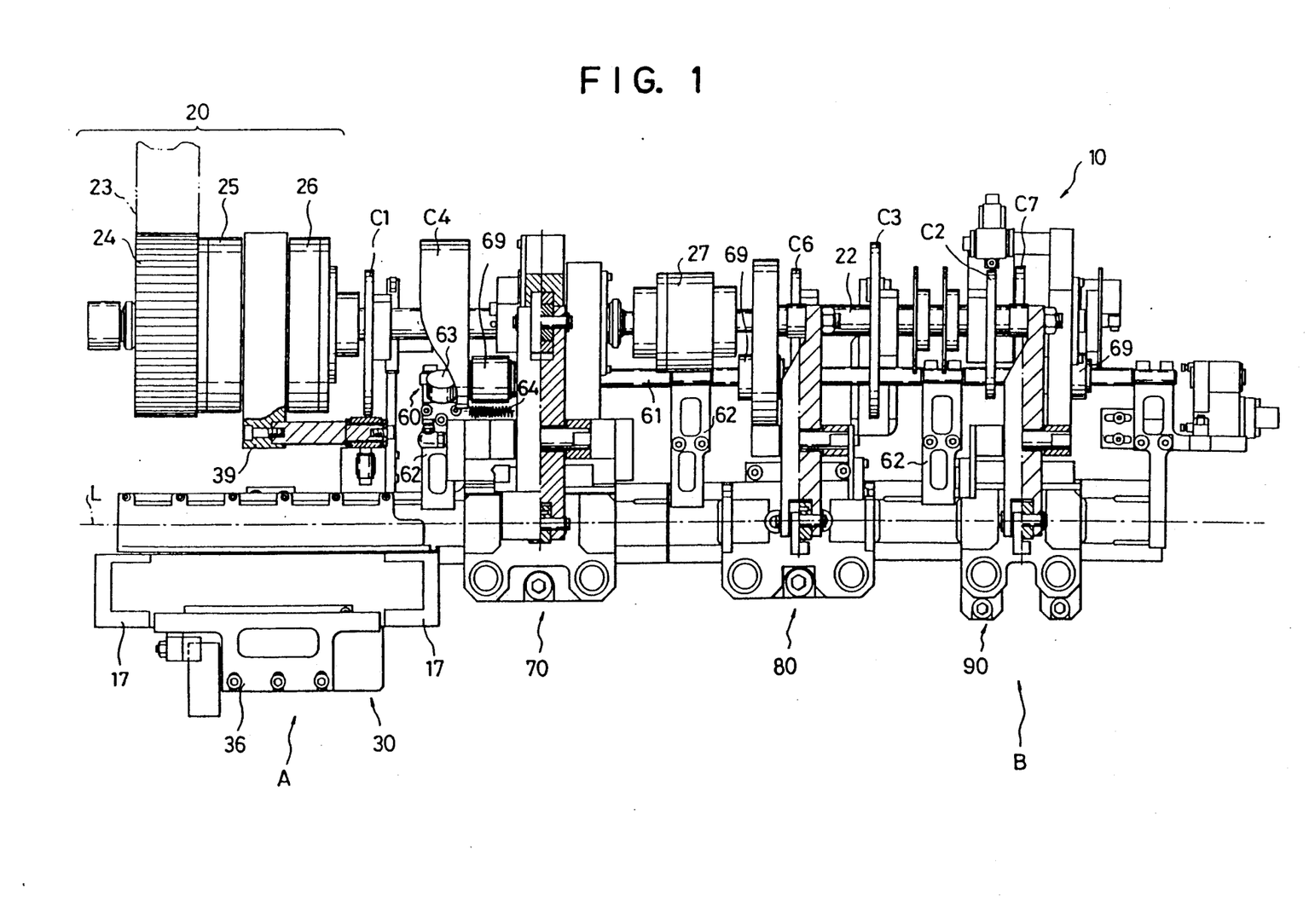
FIG. 1 is a top plan view of a press in accordance with a preferred embodiment of the invention.
Figure 2:
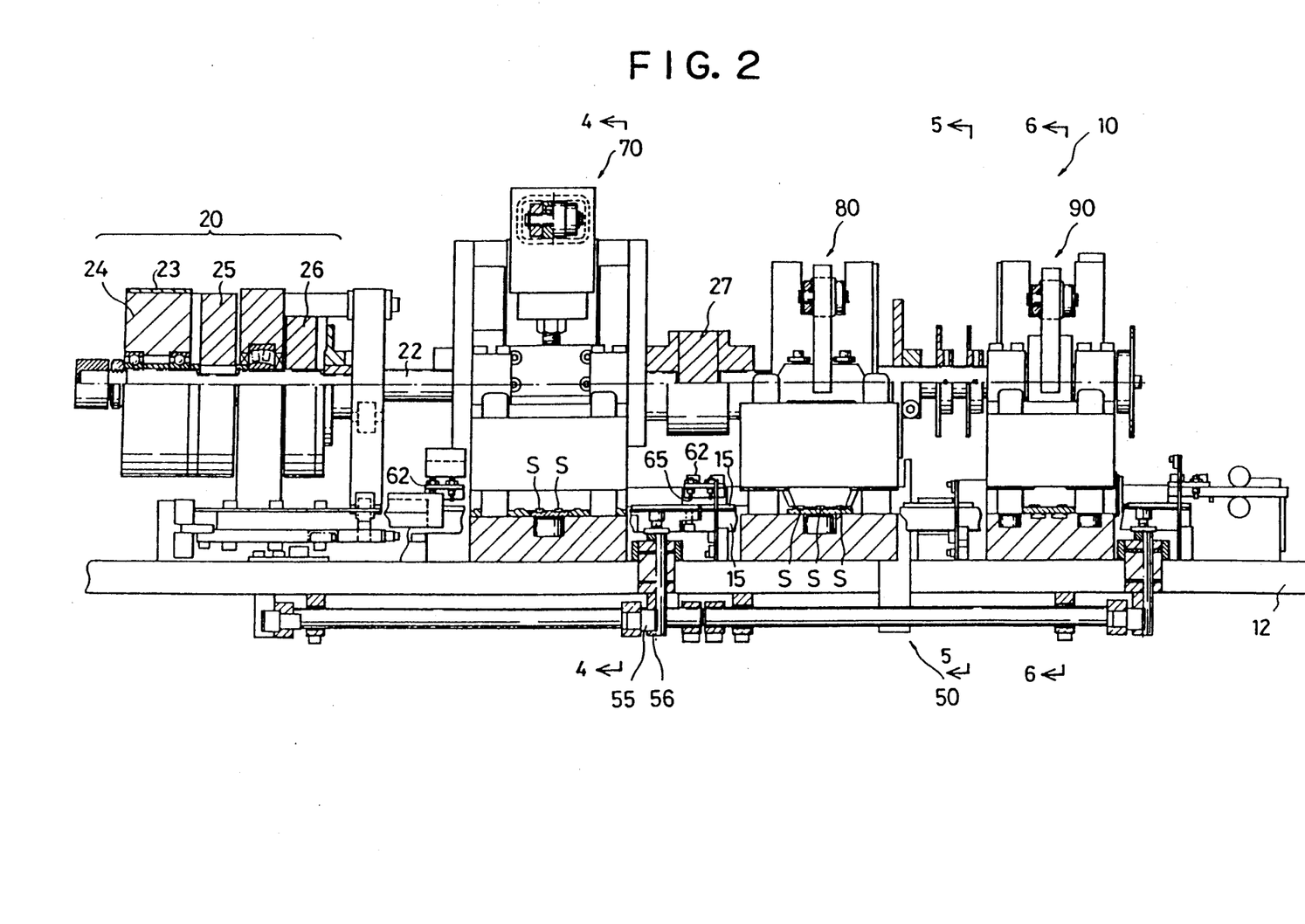
FIG. 2 is a front elevational view of the press, partly in section.

The feeding mechanism includes a take-in mechanism 30 (FIGS. 1 and 4), a take-out mechanism 40 (FIG. 6), a support base 15 (FIGS. 2, 5, 9a and 9b), and article feeding levers 62 (FIGS. 1, 2, 3 and 4). The working presses comprise a cutting press 70 (FIGS. 1, 2 and 4), a bending press 80 (FIGS. 1, 2 and 5) and a separation press 90 (FIGS. 1, 2 and 6.)

In FIG. 1, the letter L denotes a horizontal line or path along which semiconductor packages S are fed. Line L is parallel to drive shaft 22, and the fact that the drive shaft 22 is parallel to the path of movement of the packages significantly reduces the overall space requirements of the apparatus.

The semiconductor package sheet N is taken in at position A (FIG. 1) by take-in mechanism 30 and positioned on path L. It is thereafter conveyed along path L by the operation of support base 15 and feeding levers 62. Working is effected by presses 70, 80 and 90, and the finished packages are taken out at position B (FIG. 1) by take-out mechanism 40.

As all of the above-mentioned mechanisms are operated by cams C1-C7 on common shaft 22, their relative timing is dependent on the angular position of the shaft. Operation of these mechanisms by cams on a common shaft makes it possible to achieve accurate timing of the various feeding and working operations. The cams also make it possible to achieve high speed operation of the working presses.

The structure and operation of the driving mechanism 20, the take-in mechanism 30, the take-out mechanism 40, the support base 15, the article feeding levers 62 and the working presses 70, 80 and 90, will now be described in detail.

Figure 3:
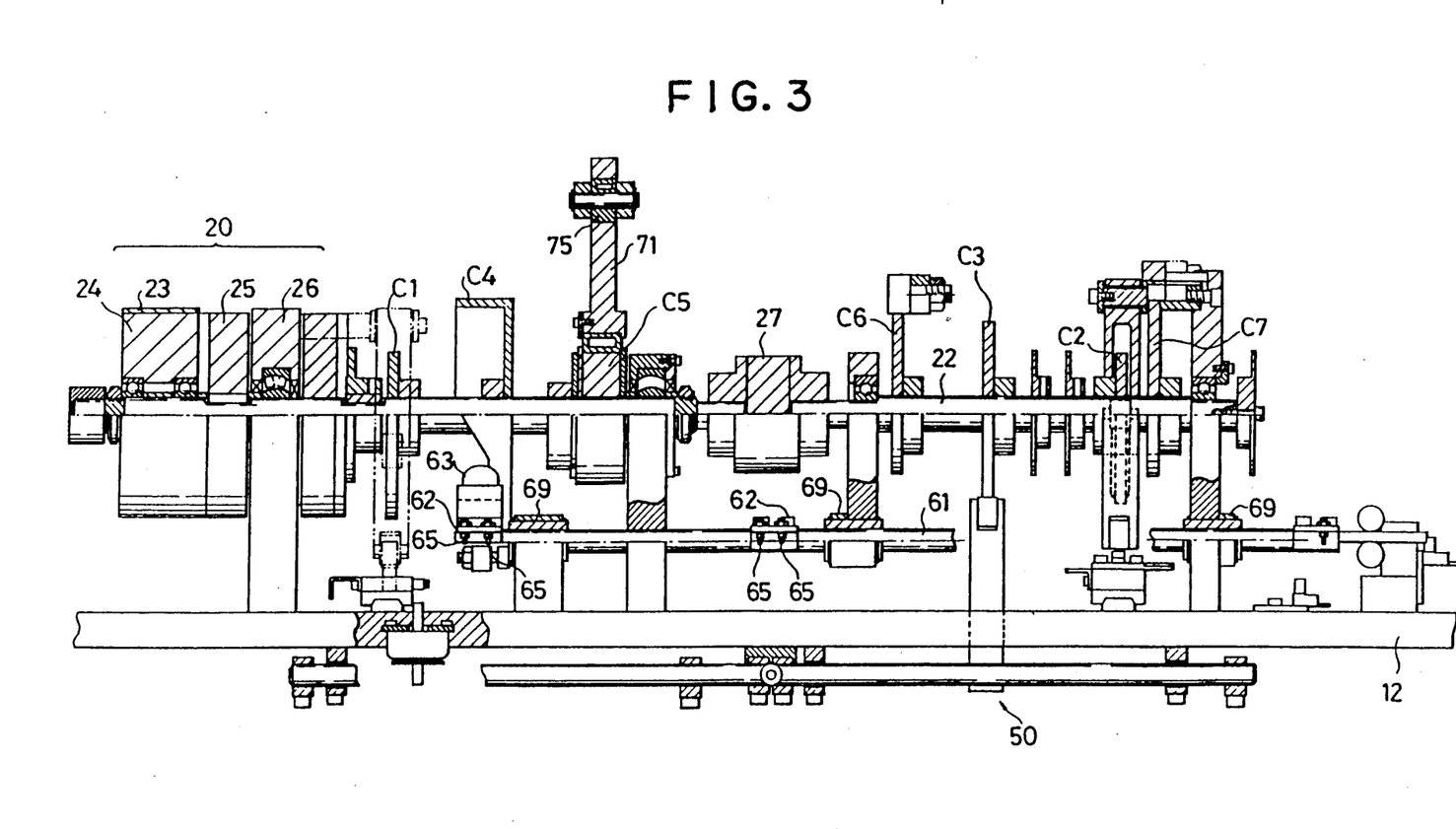
FIG. 3 is another front elevational view of the press, rendered partly in section in order to show the cams.

Driving mechanism 20 (FIGS. 1 and 4), which rotates shaft 22, is the sole source of driving power for the entire apparatus. The driving mechanism comprises a motor 21 mounted on base 12, a belt 23, a pulley 24, and a clutch 25 (FIG. 1). A shaft brake is provided at 26. Shaft 22 comprises two parts connected by a coupling 27 (FIGS. 1, 2 and 3).

Cam C1 operates the take-in mechanism. Cam C2 operates the take out mechanism. Cam C3 operates the support base 15. Cam C4 operates the feeding levers 62. Cams C5, C6 and C7 operate working presses 70, 80 and 90 respectively. The cams have contours enabling them to effect the desired operations, and are fixed to shaft 22 in relationship to one another such that the various operations are carried out at the proper times.

Figure 4:
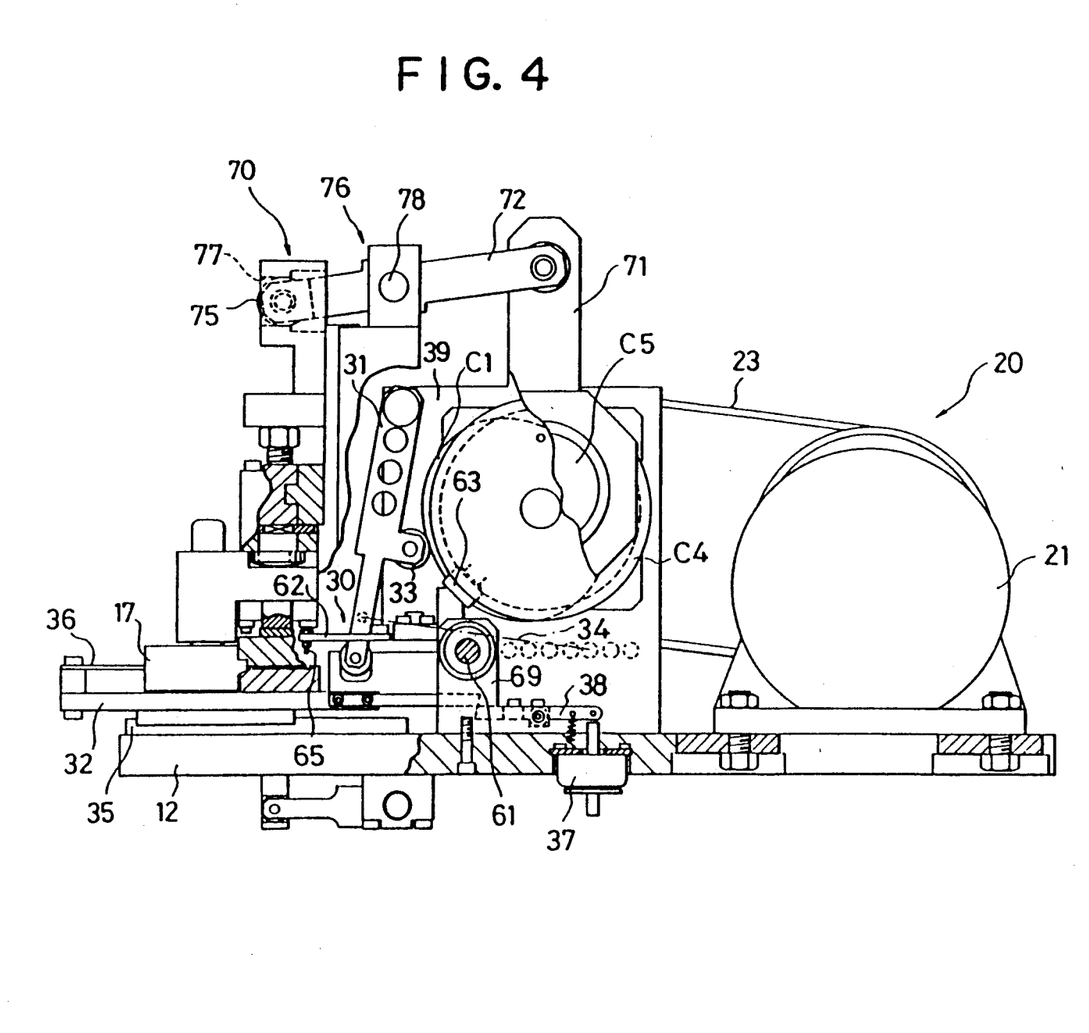
FIGS. 4, 5 and 6 are vertical sections of the press, taken on section planes 4-4, 5-5 and 6-6 respectively in FIG. 2.

The take-in mechanism 30, shown in FIGS. 1 and 4, places semiconductor package sheets N on path L along which they are fed through the working presses to take-out position B.

The take-in mechanism includes an arm 31 (FIG. 4) pivoted at its upper end on a block 39 which is erected on base 12. A cam follower 33, rotatably supported at an intermediate position on the arm, is urged against cam C1 by spring 34. Arm 31 swings about its pivot as cam C1 rotates. A slider 32 is movable horizontally and perpendicularly to the direction of path L by the end of arm 31 remote from the pivot. The slider extends beneath path L away from cam C1.

A pusher 36 is secured to slider 32 and positioned for horizontal movement back and forth on the same level with path L. A pair of channel members 17 (see FIG. 1) is provided to store a plurality of semiconductor package sheets N to be processed.

Each semiconductor package sheet N contains multiple packages S, and, in each feeding cycle in the direction of path L, the sheets are indexed through the press apparatus through a distance equal to the pitch of the packages on the sheet, or a small multiple thereof. Therefore, it is not possible to take in one package sheet N in for each revolution of shaft 22. Electrically operated magnetic solenoid 37 operates a lever 38 which normally projects into the path of slider 32, thereby preventing it from moving under the urging of spring 34 when permitted to do so by the contour of cam C1. The solenoid moves lever 38 out of the path of slider 32 during only one revolution out of a predetermined number of revolutions of the cam drive shaft 22. Package sheets N are taken into path L only during the revolution of shaft 22 in which the solenoid operates to allow slider 32 to move. Solenoid 37 and lever 38 therefore serve as means for enabling and disabling the take-in mechanism so that packages are moved into path L only in one cycle out of a predetermined number of cycles of the cam drive shaft.

Figure 5:
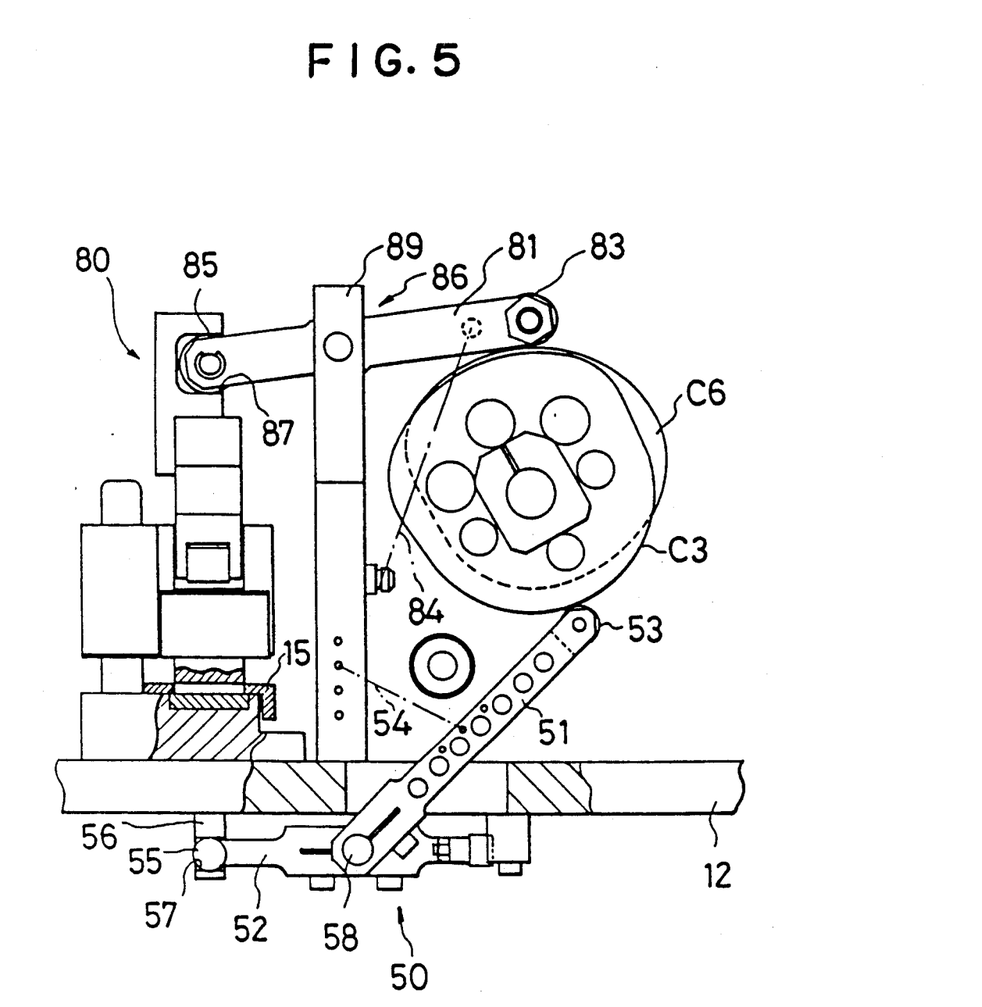
Figure 6:
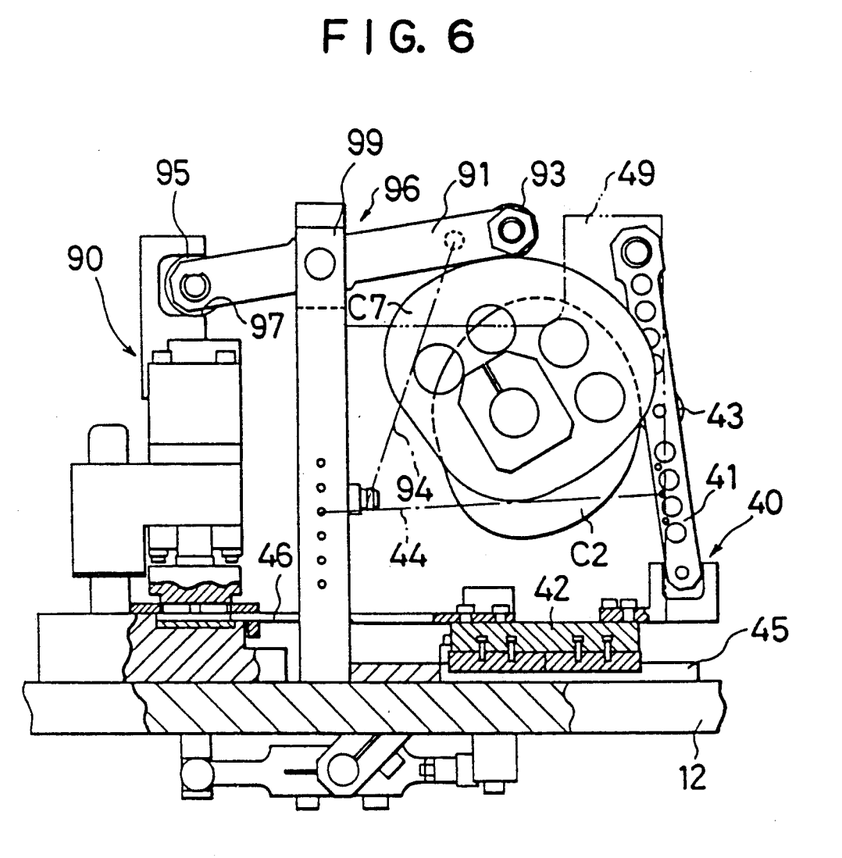

Referring to FIGS. 2 and 5, a lifting mechanism 50 is used to raise support base 15 so that semiconductor package sheets N situated on the support base can be actuated by feeding levers 62. Feeding levers 62 can only engage and move the sheets when the support base is in its raised position.

Lifting mechanism 50 includes a first arm 51 which is pivoted on a shaft 58 beneath base 12, a cam follower 53 rotatably supported at the upper end of arm 51 for contacting cam C3, and a spring 54 urging the arm 51 toward the cam. Arm 51 swings about its pivot as the cam rotates. A second arm 52 is rigidly connected to arm 51 and also pivoted on shaft 58. Thus arms 51 and 52 swing together about the pivot axis established by shaft 58. At one of its ends, roller 52 has a roller 55 which is slidably received in a recess 57 formed in a connecting rod 56. This connecting rod is connected to support base 15 and lifts the support base as arms 51 and 52 are rotated clockwise, as seen in FIG. 5.

Figure 9A:
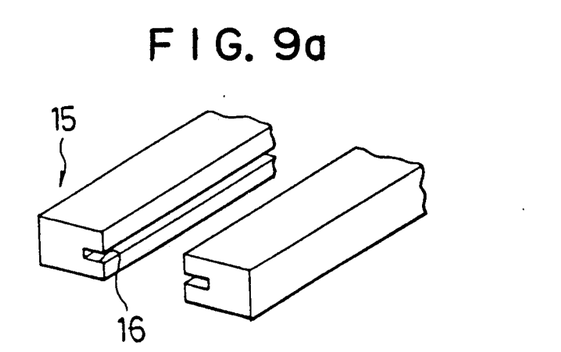
FIG. 9a is a fragmentary perspective view of an article support base.
Figure 9B:
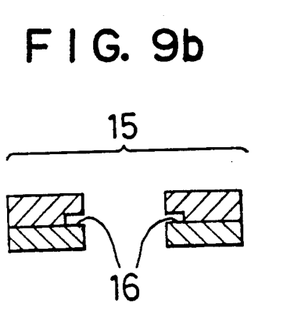
FIG. 9b is a sectional view of the article support base.

As shown in FIGS. 9a and 9b, the support base 15 comprises elements having opposed slots 16 which receive the edges of the frames so that, when the lifting mechanism 50 is raised and lowered, the semiconductor package sheets are correspondingly raised and lowered.

The article feeding mechanism comprises levers 62, as shown in FIG. 1, for feeding the semiconductor packages along path L when the support base 15 is raised by lifting mechanism 50.

Cam C4, seen in FIGS. 1, 3 and 4, operates levers 62 through a longitudinal shaft 61 which is slidable axially through bearings 69 fixed to base 12. Cam C4 is an end surface cam engaged by follower 63 secured to shaft 61. Spring 64 (FIG. 1) urges follower 63 toward the axially facing end surface of cam C4, and follower 63 and shaft 61 are moved back and forth in the direction of the axis of shaft 61 as cam C4 rotates.

Article feeding levers 62 extend from shaft 61 above path L, and have downwardly extending pins 65, as seen in FIG. 4. As shown in FIG. 7, the frame F of a semiconductor package sheet N has rows of perforations H. These perforations H are engaged by pins 65 when sheet N is raised on the support base by lifting mechanism 50. The upper surface of the support base is recessed to allow the pins to extend through perforations H.

The feeding mechanism operates by the engagement of perforations H of the package sheet by pins 65 when the support base is raised, forward movement of the levers 62 to index the package sheet forward along the support base, and disengagement of the pins from the sheet N by downward movement of the support base. When the lifting mechanism is lowered and pins 65 of the feeding levers 62 disengage the perforations of the sheet, shaft 61 is restored to its original position.

Referring now to FIGS. 1 and 6, the take-out mechanism 40 discharges processed semiconductor packages S from path L at position B. The take-out mechanism includes an arm 41, one end of which is pivoted to a block 49 mounted on base 12. A cam follower 43, rotatably supported at an intermediate position on the arm, follows the contour of cam C2, and a spring 44 urges the arm toward the cam. The arm 41 swings as cam C2 rotates. At the end of arm 41 remote from the pivoted end, there is provided a slider 42 which is movable horizontally in directions perpendicular to the direction of path L. Slider 42 is guided and supported by a linear motion bearing 45. A pusher 46 is provided at the end of slider 42 remote from arm 41. This pusher is capable of projecting into separation press 90, which is used to effect final separation of the individual semiconductor packages S from frame F.

The operation of the take-out mechanism 40 is synchronized with the operation of the separation press by cams C2 and C7 so that the discharge of semiconductor packages from path L is accurately timed.

Referring to FIGS. 3 and 4, cutting press 70 is operated by an eccentric cam C5 secured to drive shaft 22, and a link mechanism 76 including an arm 71 mounted on cam C5 as a follower, a lever arm 72, one end of which is connected to arm 71, and the other end of which is connected to the cutting press 70. An intermediate part of lever arm 72 is pivoted on shaft 78 in a block fixed to base 12. A roller 75, rotatably mounted at the end of lever arm 72 connected to the cutting press, is received in a rectangular opening 77 formed in the upper portion of the cutting press. Thus, the cutting press is operated forcibly by cam C5 through lever arm 72.

The bending press 80, as shown in FIG. 5, serves to bend the leads R (FIG. 8) of the semiconductor packages S. The link mechanism 86 for operating bending press 80 comprises a lever arm 81 pivoted near its midpoint in a block 89 erected on base 12, a cam follower 83 rotatably supported at one end of lever arm 81, and a spring 84 urging the lever arm in a direction such that follower 83 is maintained in contact with cam C6. Lever arm 81 swings as cam C6 rotates. A roller 85, rotatably supported at the opposite end of lever arm 81, is received in a recess 85 formed near the upper end of the punch of bending press 80. Thus, the bending press 80 is forcibly operated by cam C6 through lever arm 81.

Referring now to FIG. 6, the separation press 90, which effects final separation of the semiconductor packages S from the frame F, is operated through a link mechanism 96 which comprises a lever arm 91 pivoted near its mid-point in a block 99 erected on base 12, a cam follower 93 rotatably supported at one end of lever arm 91, and a spring 94 urging the lever arm in a direction such that follower 93 is maintained in contact with cam C7. Lever arm 91 therefore swings as cam C7 rotates. A roller 95, rotatably supported at the opposite end of lever arm 91, is received in a recess 95 formed near the upper end of the punch of separation press 90. Thus the separation press is forcibly operated by cam C7 through lever arm 91.

Figure 10:
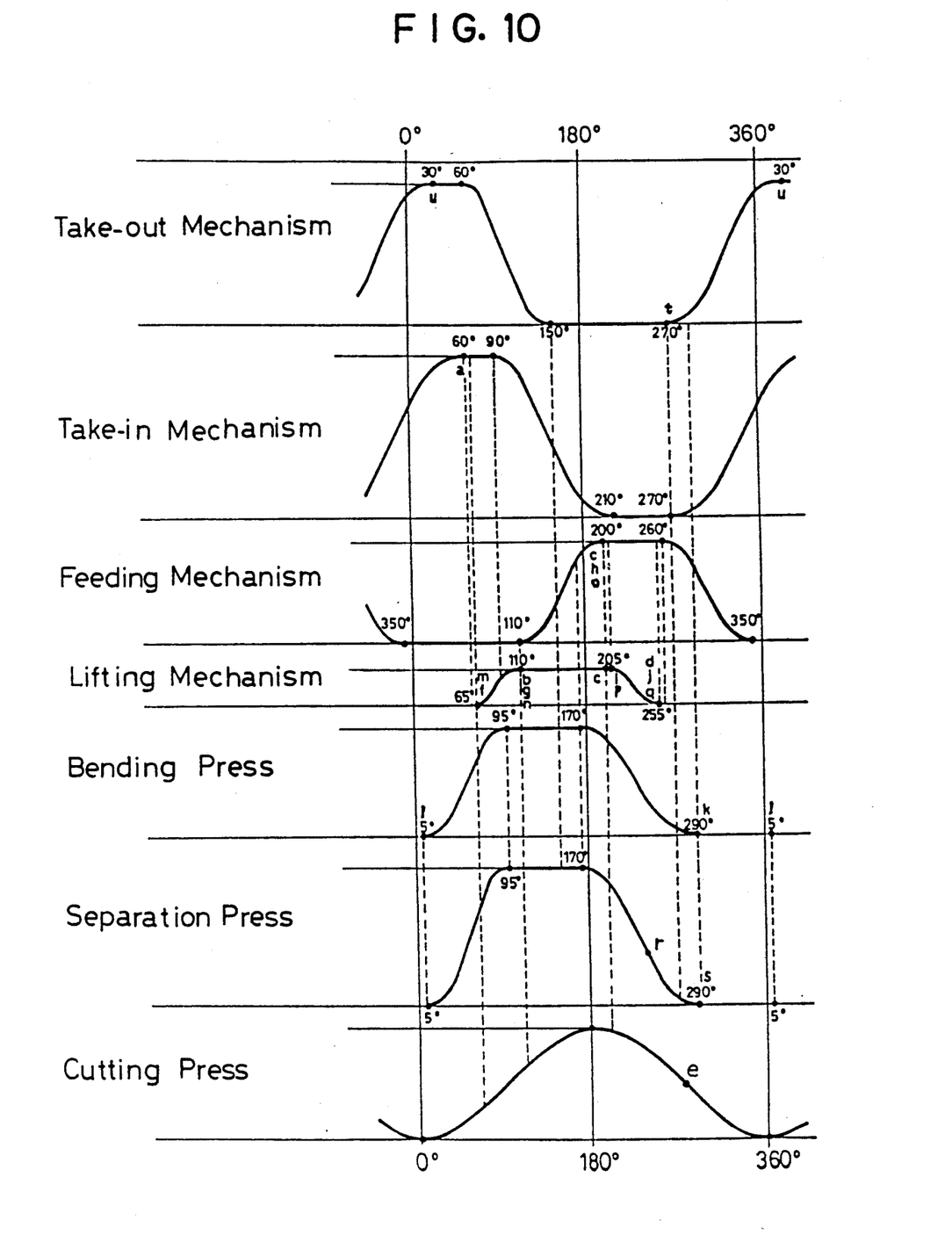
FIG. 10 is a timing diagram illustrating the relationship of the operations of the components of the press.

FIG. 10 illustrates the timing of the operations of the working presses and the take-in, take-out, feeding and lifting mechanisms described above. The working steps carried out with respect to one semiconductor package S in a sheet N will be explained. The angles given in FIG. 10 denote the angular position of the drive shaft 22 relative to a fixed reference.

In the taking-in operation of a package sheet N, cam follower 33 of take-in mechanism 30 follows cam C1 on the condition that solenoid 37 has been energized. The pusher 36 transfers one package sheet, from a stack of sheets held between channel members 17, toward path L. Transfer by the take-in mechanism is complete at point "a" in FIG. 10. Almost immediately following point "a", the support base 15 begins its ascent under the operation of cam C3, as seen in the curve adjacent to the legend "Lifting Mechanism". When the support base reaches its uppermost position, at point "b", pins 65 of a feeding lever 62 engage the perforations H of the package sheet N. While the engagement of the perforations H by pins 65 takes place, the feeding lever 62 moves forward from points "b" to "c". When feeding is complete, at point "c", the support base 15 begins to descend, and pins 65 disengage from the perforations H of the package sheet. At point "d", the support base reaches its lowermost position. Immediately thereafter, cam C4 begins to restore feeding lever 62 to its original position. By repeating the above procedure, each package sheet N is fed to the position of the cutting press 70.

Cutting press 70 is in operation at all times, being operated by cam C5. While the punch of the cutting press is raised, a package sheet N is fed to the appropriate position by a lever 62, and the leads R are cut after the support base has been lowered. Cutting takes place at point "e" as shown in FIG. 10 on the curve adjacent to the legend "Cutting Press". At this time, some of the leads R of the semiconductor package remain uncut, so that the package remains bonded to the frame F of the sheet.

After the punch of the cutting press 70 disengages from the package sheet N, the package sheet is fed to the position of bending press 80. This is accomplished by ascent of the support base (initiated at point "f" and completed at point "g"), forward motion of a lever 62 (initiated at point "g" and completed at point "h"), and descent of the support base (initiated at point "i" and completed at point "j". The lever 62 is returned to its initial position, as before.

The bending press 80 is also in continuous operation, being operated by cam C6. While the punch of the cutting press is raised, the package sheet N is fed to the appropriate position by a lever 62, and the leads R of the package are bent after the support base has been lowered. Bending takes place between points "k" and "l" adjacent to the legend "Bending Press" in FIG. 10.

After the punch of the bending press 80 disengages from the package sheet N, the package sheet is fed to the position of the separation press 90. This is accomplished by ascent of the support base (initiated at point "m" and completed at point "n"), forward motion of a lever 62 (initiated at point "n" and completed at point "o"), and descent of the support base (initiated at point "p" and completed at point "q". Here again, the lever 62 is returned to its initial position.

The separation press 90 is in continuous operation, being operated by cam C7. While the punch of the separation press is raised, the package sheet N is fed to the appropriate position by a lever 62, and the remaining leads R connecting the package S to frame F are cut after the support base has been lowered. The package S thus separated is discharged through an opening (not shown) in the separation press. In FIG. 10, the point "s" is the lower dead center point for the separation press, and separation takes place at point "r" before the punch of the separation press reaches its lower dead center point. Pusher 46 (FIG. 6) of the take-out mechanism begins to operate at point "t", which occurs shortly after point "r", and pushes the discharged package S out perpendicularly with respect to path L.

Working of articles by the press in accordance with this invention is effected at high speed, partly because the working presses are cam-operated, thereby eliminating the delays inherent in fluid-operated presses, and partly because the use of cams on a common shaft for operating the working presses, and the article feeding mechanisms makes it possible to achieve accurate timing and coordination of the various components, even when operated at high speed. Operational speeds as high as five hundred cycles per minute have been achieved with presses constructed in accordance with the invention.

Various modifications can be made to the apparatus described. For example, the apparatus can include additional working presses for carrying out other operations on semiconductor packages or similar components, such as printing identifying marks, or performing additional cutting and bending operations. Still further modifications may be made to the apparatus without departing from the scope of the invention as defined in the following claims.

I claim:

1. Apparatus for processing semiconductor packages and the like comprising:

means providing a work press adapted to perform an operation on a package sheet;

feeding means for moving package sheets to and from said work press, said feeding means comprising at least one article support movable toward and away from a path extending through said work press, and at least one article feeding lever reciprocably movable along the direction of said path, said article feeding lever having means for engaging package sheets and indexing said package sheets along said path by movement of the article feeding lever in a forward direction when said article support is moved toward said path, and said article feeding lever being movable in a reverse direction without reverse movement of said package sheets when said article support is moved away from said path;

first means for operating said work press;

second means for effecting reciprocating movement of said article feeding lever along the direction of said path;

third means for effecting movement of said article support toward and away from said path; and a common drive shaft;

said first, second and third means all comprising cams arranged on said common drive shaft.

2. Apparatus according to claim 1 in which said path is substantially straight, and said common drive shaft has an axis of rotation parallel to said path.

3. Apparatus according to claim 1 in which said first, second and third means operate said work presses, said feeding lever, and said article support in each cycle of a repeating series of cycles, and including take-in means for moving packages into said path, and means for enabling and disabling said take-in means whereby packages are moved into said path by said take-in means only in one cycle out of a predetermined number of said repeating cycles.

4. Apparatus for processing semiconductor packages and the like comprising:

means providing a series of work presses, each press of said series being adapted to perform a separate operation on a package sheet;

feeding means for moving package sheets to and from each of said work presses in succession, said feeding means comprising at least one article support movable toward and away from a path extending through said work presses, and at least one article feeding lever reciprocably movable along the direction of said path, said article feeding lever having means for engaging package sheets and indexing said package sheets along said path by movement of the article feeding lever in a forward direction when said article support is moved toward said path, and said article feeding lever being movable in a reverse direction without reverse movement of said package sheets when said article support is moved away from said path;

first means for operating said work press;

second means for effecting reciprocating movement of said article feeding lever along the direction of said path;

third means for effecting movement of said article support toward and away from said path; and a common drive shaft;

said first, second and third means all comprising cams arranged on said common drive shaft.

5. Apparatus according to claim 4 in which said path is substantially straight, and said common drive shaft has an axis of rotation parallel to said path.

6. Apparatus according to claim 5 in which said first, second and third means operate said work presses, said feeding lever, and said article support in each cycle of a repeating series of cycles, and further including take-in means for moving packages into said path, and means for enabling and disabling said take-in means whereby packages are moved into said path by said take-in means only in one cycle out of a predetermined number of said repeating cycles.

* * * * *